United States Patent [19]

Roecks et al.

[11] 4,286,201
[45] Aug. 25, 1981

[54] AUTOMATIC PART POSITIONING SYSTEM

[75] Inventors: Carl C. Roecks; Stuart C. Baker, both of Palos Verdes Estates, Calif.

[73] Assignee: Amistar Corporation, Torrance, Calif.

[21] Appl. No.: 13,180

[22] Filed: Feb. 21, 1979

[51] Int. Cl.³ .............................................. G05B 1/06
[52] U.S. Cl. .................. 318/640; 250/561; 356/400
[58] Field of Search ............. 318/640; 356/399, 400; 250/561; 29/626, 833

[56] References Cited

U.S. PATENT DOCUMENTS

| | | | |
|---|---|---|---|
| 3,893,232 | 7/1975 | Fletcher et al. | 29/626 |
| 3,918,814 | 11/1975 | Weiser | 356/400 |
| 3,930,150 | 12/1975 | Marantette | 356/400 |
| 4,109,158 | 8/1978 | Blitchington et al. | 356/400 |
| 4,151,451 | 4/1979 | Maertins et al. | 318/640 |

OTHER PUBLICATIONS

Carson et al., *IBM Technical Disclosure Bulletin*, vol. 21, No. 2, Jul. 1978 pp. 741–742.

Falkner, *Journal of Physics*, vol. 7, pp. 798–800, Oct. 1978.

*Primary Examiner*—J. V. Truhe
*Assistant Examiner*—Eugene S. Indyk
*Attorney, Agent, or Firm*—John Holtrichter, Jr.

[57] ABSTRACT

A system for precisely positioning a printed circuit board relative to a component insertion tool, the system including a circuit board-holding frame movable with two degrees of freedom in a plane by a servomechanism coupled to a photo detector assembly positioned on the opposite side of the printed circuit board from a light beam generator producing a single beam or a pair of parallel light beams spaced a distance equal to the distance between a pair of holes in the circuit board. Light pipes or a pair of orthogonally oriented wedge-shaped beam splitting members are positioned between the photo detector assembly and the circuit board for splitting each of the beams and thereby illuminating orthogonally oriented pairs of photo cells equally when the board is in a desired position relative to the light beams and providing to the servomechanism with an error signal to correct the position of the board when it is not in such alignment.

9 Claims, 9 Drawing Figures

AUTOMATIC PART POSITIONING SYSTEM

BACKGROUND OF THE INVENTION

The background of the invention will be set forth in two parts.

1. Field of the Invention

This invention relates to automatic machine tool systems and more particularly to electrical component insertion machines to stuff printed circuit boards.

2. Description of the Prior Art

Machine tools having a movable workpiece support carriage have long been equipped with automatic means for controlling the position of the carriage to a predetermined position or to a predetermined sequence of positions relative to a particular portion of the machine.

In the past, these functions have been programmed by means of mechanical and electromechanical means such as cams, switches and the like. Later, electronic techniques were employed for more accurate positioning and more complicated and more numerous sequential positioning. However, many of these machines require elaborate and very expensive tooling and components in order to ensure accurate results. For example, some schemes utilize expensive laser beam generators, while others use photosensitive elements with precision-produced exactly-tensioned perforated tapes, such as described in U.S. Pat. Nos. 3,603,691 and 3,586,950, respectively. Further, with respect to the state of the art dealing with positioning of a workpiece and the like, reference may be made to such patents as U.S. Pat. No. 3,786,332 disclosing positioning apparatus for moving a workpiece only a very small distance but with high precision (microns) and uses a laser light source and piezoelectric ceramic or magnetostrictive elements as drives, the displacement being measured by four interferometers whose beams illuminate reflecting faces of a reference block which supports the workpiece.

Another elaborate positioning scheme is described in U.S. Pat. No. 3,739,247. Here is found a positioning device for setting an article in a predetermined position, the article being positioned having a referential pattern of predetermined shape formed on a surface thereof. The device includes reference pattern carrier means having a reference pattern whose base portion is substantially similar in shape to the referential pattern of the article. Means is provided to move the article in a plane and to a position where the referential pattern on the article and at least the base portion of the superimposed images of the two patterns are scanned by photoelectric converter means to convert such images into electrical signals which are detected to determine the extent of deviation between the two patterns and to generate an error signal to activate movement means to correct such deviation.

U.S. Pat. No. 3,590,356 is pertinent in this area in that it concerns a light sensitive servomotor control circuit including a voltage sensitive motor, the circuit including two light sensitive elements which receive equal amounts of light when another element which is controlled by the circuit is positioned properly. Undesired movement of the element results in changes in the light received by the light sensitive elements thereby resulting in a loss of their equality. The diodes form a part of a balanced circuit, across which the motor is connected. In the balanced position, both sides of the motor are at the same potential and it remains stationary. When the control circuit becomes unbalanced in response to changes in the light sensitive elements, the motor is connected across a potential difference and rotates in a direction dictated by the direction of the potential difference. Rotation of the motor in the correct direction corrects the position of the elements under control and simultaneously equalizes the light impinging upon the light sensitive elements and thereby balances the control circuit.

As can be seen, light beam generators and light beam detectors play a significant part in many of the above-noted systems. In fact most of the more recent developments in this field utilize light beams because better accuracy is generally available. For example, in U.S. Pat. No. 3,808,485 there is described apparatus for registering a first element relative to a movable second element whereby a movable member has an initial position and is adapted to be moved to a predetermined relative relationship to the desired portion of the first element. A light source and a light receiver are cooperably arranged relative to each other, and a light modulating means passes light from the source to the light receiver such that a varying light intensity is passed thereby to the light receiver at different positions.

Probably the most pertinent examples of techniques using the detection of light energy to determine desired alignment of a movable object with respect to a fixed reference, now known to the inventors, are the following:

U.S. Pat. No. 3,482,103 describes a system for indicating direction and magnitude of deviation from a desired path of travel of a movable device or vehicle along a predetermined reference line. A light source is affixed to the vehicle and a remotely located light collector means is aligned parallel to the path center line and receives light rays from the source which are parallel to the vehicle travel direction. A plurality of photocells are positioned symmetrically about the optical axis of the aligned light collector means, and the photocells are responsive to changes in relative illumination about the optical axis.

U.S. Pat. No. 3,723,013 involves an alignment system which utilizes intermediate photodectors having central apertures and a terminal photodector, each photodetector having four quadrants of active area, with their centers aligned on the axis of a laser beam, their output signals bring utilized to indicate alignment, or the degree of misalignment, of their centers with respect to the axis of the laser beam. Alternately, their output signals are utilized to drive servo systems that automatically move tables on which they are mounted into alignment.

U.S. Pat. No. 3,749,924 concerns a target position detecting device for a line or edge target, the device using a plurality of detector photocells and a plurality of receiver optic fiber bundles which transmit light reflected from discrete areas of the target to the detector photocells.

U.S. Pat. No. 4,025,785 describes a device for automatic focusing of a stereoscopic microscope which generates a beam of rays from a pulse light source, which beam is focused on the object to be observed, the rays reflected back from the object along the divided paths of the observation rays are deflected from those paths and directed to impinge on separate photoelectric detectors which convert axial shifts of the object plane with respect to the microscope into a directionally dependent electric signal which controls a focusing motor to move the microscope to compensate for such shifts.

A study of the above-noted references will show that most use a beam of light which is generated usually by an expensive and complicated laser generator. It should therefore be evident that a new technique which need only utilize a simple incandescent source which easily produces a simply focused light beam or beams to detect any misalignment of a workpiece with respect to a desired position would constitute a significant advancement of the art.

SUMMARY OF THE INVENTION

In view of the foregoing factors and conditions characteristic of the prior art, it is a primary object of the present invention to provide an improved automatic positioning system.

Another object of the present invention is to provide a simple yet effective and reliable automatic positioning system for precisely positioning a printed circuit board relative to a component insertion tool.

Still another object of the present invention is to provide a two beam positioning system which senses x-y axis misalignment and causes a servo system to move a movable printed circuit-holding table to a desired alignment position.

In accordance with one embodiment of the present invention, an automatic part positioning system for precisely locating a printed circuit board with respect to a component inserting tool includes a frame movable in a predetermined plane and has two degrees of freedom, the frame including means for supporting a printed circuit board having at least one pair of electrical component-accepting holes, the holes being spaced a predetermined distance apart. The system also includes a servomechanism operatively coupled to the frame for moving the frame in the aforementioned plane. A light generator is positioned adjacent one side of the frame and produces a pair of parallel light beams spaced apart by the above-indicated predetermined distance. On the opposite side of the frame is mounted a light detecting assembly including two pairs of photodetectors, each pair lying on different intersecting orthogonal lines. And disposed between the position of the printed circuit board and the light detecting assembly is mounted a beam splitting structure including orthogonally oriented wedges, each splitting a different one of the beams to illuminate equally each of the pairs of photodetectors when the holes in the printed circuit board are in a predetermined alignment relative to the light beams, and alternately producing an error signal coupled to the servomechanism to correct any misalignment.

Also, in accordance with another embodiment of the present invention, an automatic part positioning system for precisely locating, with respect to a component inserting tool, a printed circuit board and the like with at least one hole therethrough, includes servo means operatively coupled to a circuit board-supporting frame movable in a predetermined plane with two degrees of freedom, for moving the frame in the plane in response to error signals. This embodiment of the invention also includes light generating means positioned adjacent one side of the frame for generating at least one beam of light toward the frame, and light detecting means disposed on the side of the frame opposite the light generating means, the light detecting means being coupled to the servo means and including two pairs of light detectors, each pair lying on a different one of two orthogonal lines for producing error signals relative to the direction of the orthogonal lines when the detectors are not illuminated equally. Further, this embodiment includes beam dividing means disposed between the light generating means and the light detecting means to intercept light beam energy from the light generating means and to direct the light beam energy toward selected different ones of the light detectors, the light detectors only receiving such amount of the light beam energy which passes through the plane.

The features of the present invention which are believed to be novel are set forth with particularity in the appended claims. The present invention, both as to its organization and manner of operation, together with further objects and advantages thereof may best be understood by making reference to the following description taken in conjunction with the accompanying drawings in which like reference characters refer to like elements in the several views.

DESCRIPTION OF THE PREFERRED EMBODIMENTS

Figure 1:
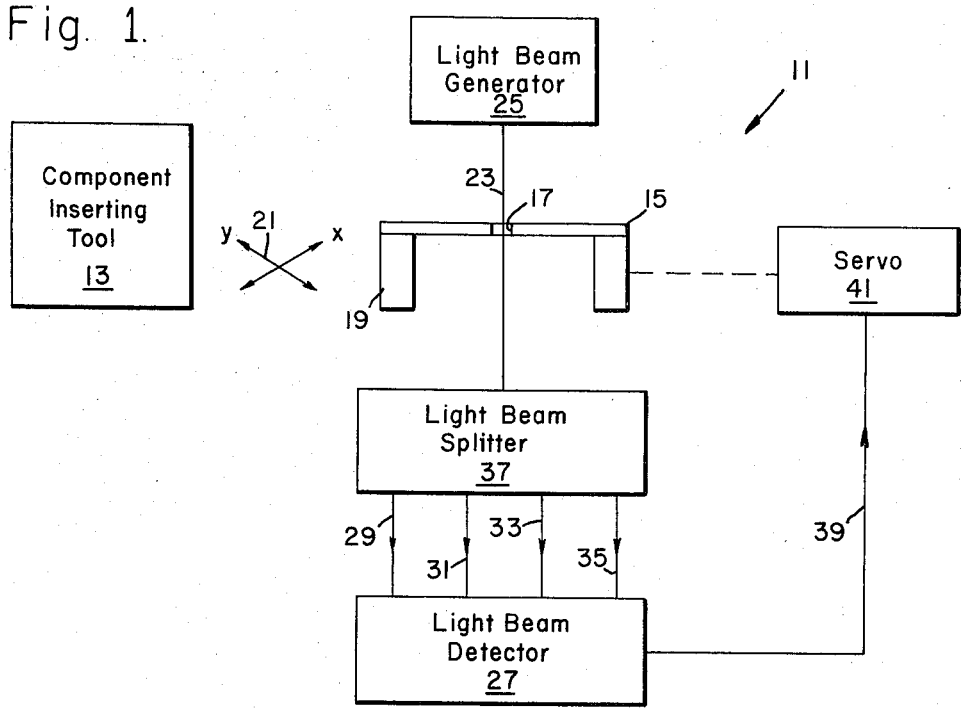
FIG. 1 is a block diagram of an automatic part positioning system for precisely locating a printed circuit board, having at least one hole therethrough, with respect to a component inserting tool, in accordance with the present invention.

Referring now to the drawings and more particularly to FIG. 1, there is shown diagrammatically an automatic part positioning system 11 for precisely locating, with respect to a component inserting tool 13, a printed circuit board 15, and the like, where the board has at least one hole 17 therethrough. The system includes a circuit board-supporting frame 19 movable in a predetermined plane, represented by crossed arrows 21, with four degrees of freedom in the x-y directions, for example. A light beam 23 (or a pair of light beams 23') is generated by a light beam generator 25 and may pass through the hole 17 in the circuit board 15 to impinge upon a light beam detector 27 after being split into four portions 29, 31, 33, and 35 by a light beam splitter 37. The light beam detector 23 is coupled electrically by line 39 to a conventional servomechanism 41 that is mechanically coupled to the x-y table or frame 19, as schematically represented in FIG. 2.

Figure 2:
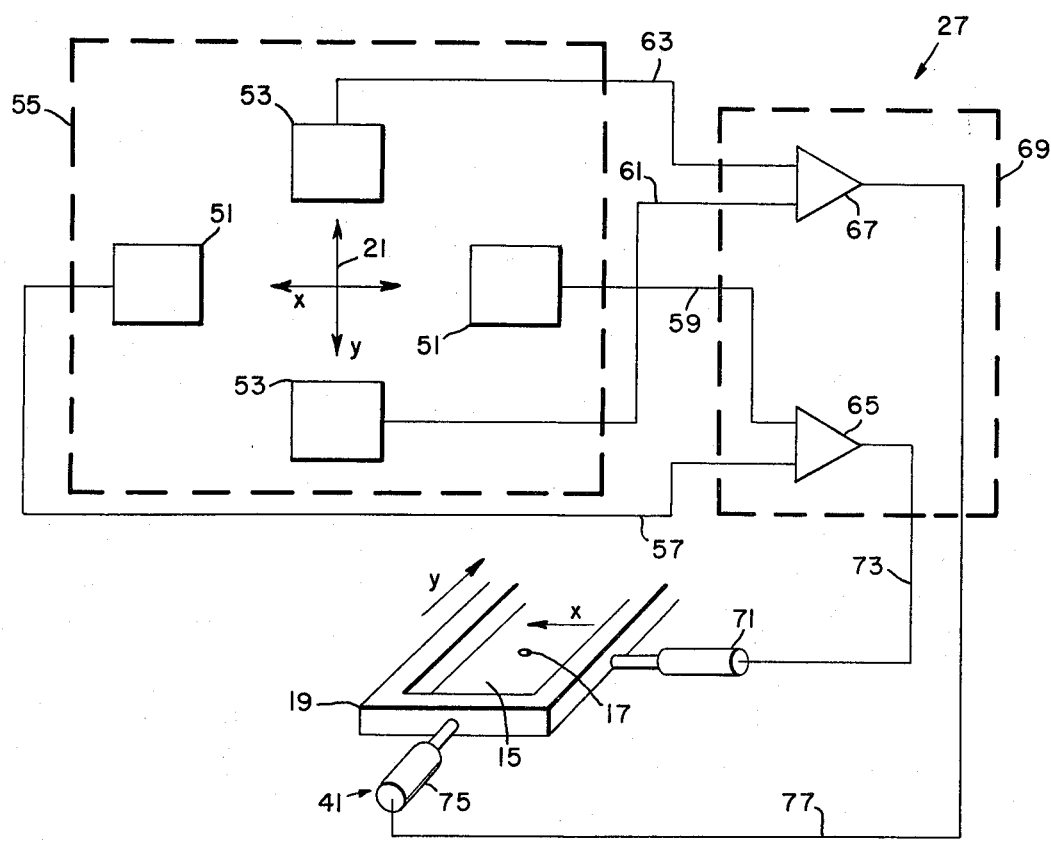
FIG. 2 is a schematic representation of the interrelationship between the light beam detector, the servomechanism and the circuit board-supporting frame in accordance with an embodiment of the present invention.

The light beam detector 27 includes two pair of conventional light sensitive diode detectors 51 and 53 mounted on a detector board 55, each of which detectors is coupled separately by leads 57, 59, 61 and 63 to two separate two-input amplifiers 65 and 67 which may be mounted on the same board or on a separate board 69, as shown in FIG. 2. The first amplifier 65 is shown coupled to a conventional servo motor 71 by lead 73, while the second servo motor 75 is driven through lead 77 by the second amplifier 67.

Figure 3:
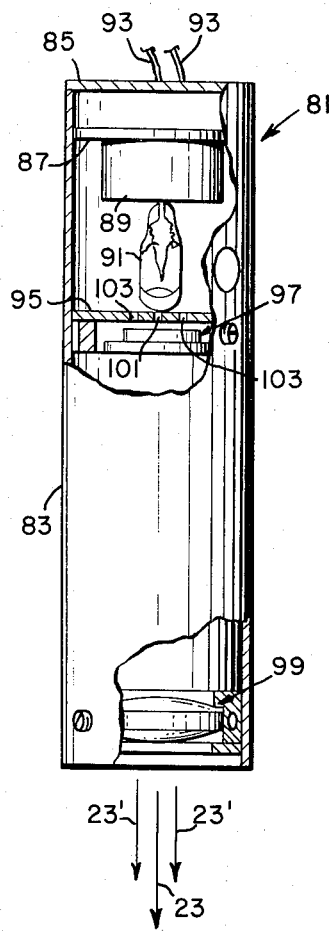
FIG. 3 is a side elevational view, partially broken away, of a light beam generating portion of the present invention.

The light beam generator 25 may include, as illustrated in FIG. 3, a lamp assembly 81 having an outer cylindrical shell 83, an upper end plate 85, and a lamp base plate 87 supporting a lamp socket 89 for a conventional miniature high intensity lamp 91. The lamp is connected to a conventional power supply (not shown) through wires 93, and some of the light energy produced by the energized bulb 91 passes through an aperture plate 95 and then through an upper and lower optical system 97 and 99, respectively, to produce a focused beam or beams of light energy 23 or 23'. Where a single beam is desired, a single aperture 101 is provided in the plate 95. Alternately, a pair of spaced apertures 103 may be incorporated in the plate 95 where a pair of spaced beams 23' are required. The optical systems are well known in the art and are not therefore described here in detail.

Figure 4:
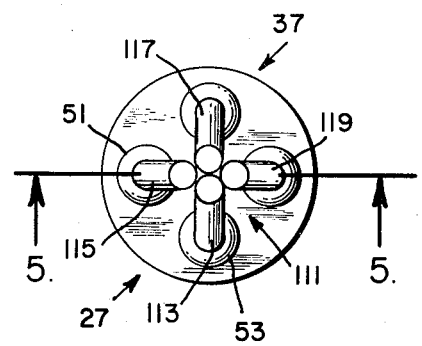
FIG. 4 is a top plan view of a light beam splitter assembly according to an embodiment of the invention.
Figure 5:
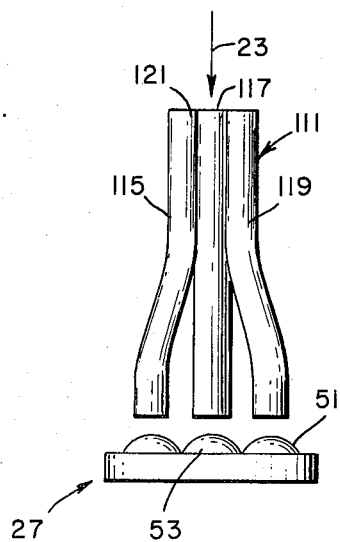
FIG. 5 is a side elevational view of the embodiment of the present invention shown in FIG. 4, taken along line 5—5.

In the single beam embodiment of the invention, the light beam 23 must pass through a hole, such as hole 17 in the board 15, before being split into two orthogonal pairs of beams by the light beam splitter 37. Such splitting may be accomplished as shown in FIGS. 4 and 5 where a light pipe bundle 111 includes four individual light pipes 113, 115, 117 and 119 which opposite pipes comprise the orthogonal beam splitting members of the beam splitter 37. Thus, a single light beam 23 that impinges on the entrance end 121 of the bundle 111 will emerge as the four separate beams 29-35, and be directed toward the light beam detector 27 and the orthogonally oriented light sensitive diode pairs 51-53.

In the case where the axis of the hole 17 is coaxial with the axis of the beam 23, the diode pairs 51-53 will be equally illuminated, and as these diodes are coupled to what is in effect a bridge circuit, a zero or null error signal will be generated and the servo motors 71 and 75 will not be activated. However, if a portion of the beam 23 is intercepted by the board 15, the illumination of the diodes will not be uniform, which will unbalance the bridge circuit and cause an error signal to be fed to the servo system. The error signal is of such polarity as to cause the servo motors to rotate in a direction whereby the frame 19 and its captured board 15 is brought into perfect alignment with the beam 23.

Figure 6:
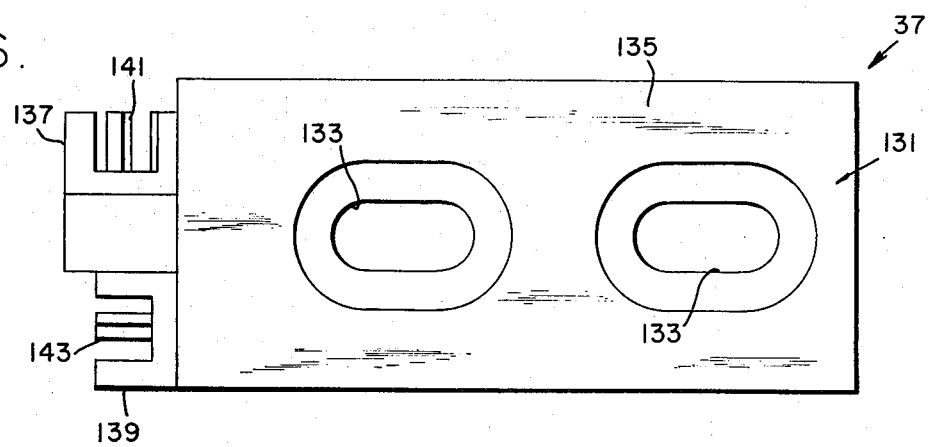
FIG. 6 is a top plan view of a beam splitting block in accordance with still another embodiment of the present invention.
Figure 7:
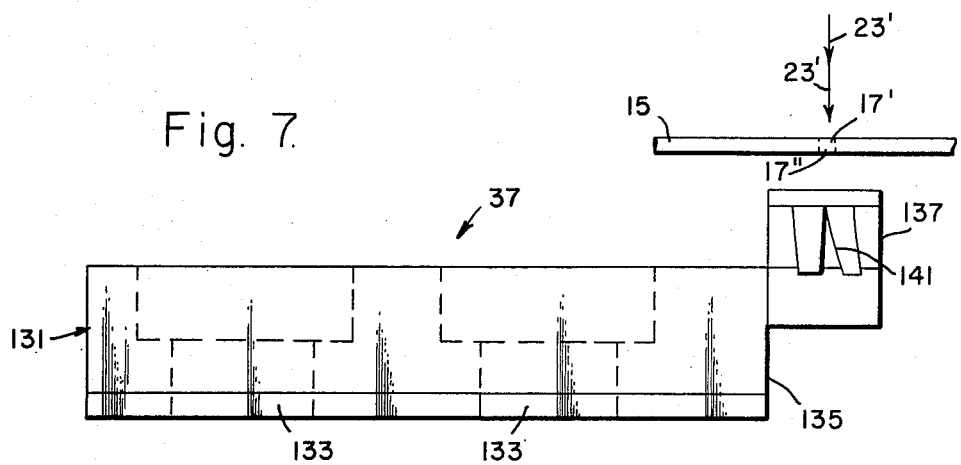
FIG. 7 is a side elevational view of the beam splitting block of FIG. 6.

Referring now to the two-beam embodiment of the present invention, FIGS. 6 and 7 show a beam splitting block 131 having mounting holes 133 in the base portion 135 of the block, and having two separate beam splitting portions, namely an x-splitter 137 and a y-splitter 139. When the board 15 is properly aligned, one of the beams 23' will pass through a board aperture 17' and will be split into two beams 29 and 33 by an x-axis wedge 141 of the x-splitter portion 137. Of course, these two beams lie on a line in the x-axis direction. Simultaneously, the other of the beams 23' will pass through another board aperture 17" and will be split into two beams 31 and 35 by a y-axis wedge 143 of the y-splitter portion 139. Thus, each of the two beams are split into orthogonally oriented beam pairs to be detected by the appropriately positioned orthogonally oriented detector pairs.

Figure 8:
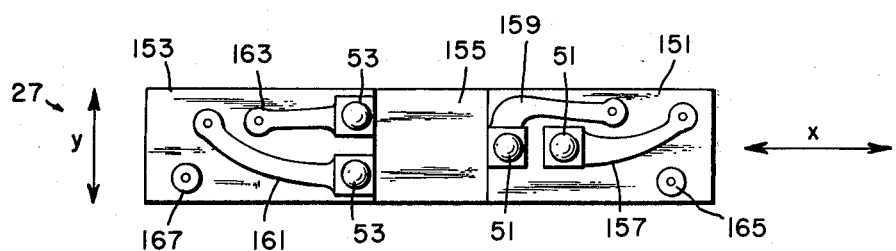
FIG. 8 is a top plan view of a beam detector board in accordance with yet a further embodiment of the present invention.
Figure 9:
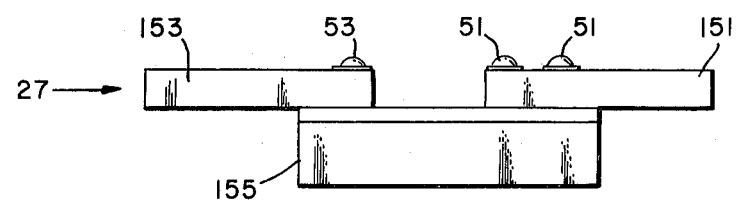
FIG. 9 is a side elevational view of the board of FIG. 8.

FIGS. 8 and 9 are views of the light beam detector 27 in accordance with an embodiment of the present invention. First and second printed circuit cards 151 and 153 are mounted on a detector base plate 155 by any conventional means, the cards each carrying a different one of the pair of light sensitive diodes 51, 53. Each diode is electrically contacted through associated conductive traces 157, 159, 161, 163 and common traces 165 and 167, as is the normal practice in the art.

From the foregoing, it should be evident that there has herein been described an improved automatic part positioning system that utilizes one or two light beams passing through a hole or holes in a board or plate in order to determine if the board is in perfect alignment with respect to a desired machine tool portion, and to move a board-carrying frame in a direction or directions to correct for any misalignment.

Normally, a board to be populated with electrical components, for example, will have one or more tooling or locating holes therein for alignment purposes. However, the locations of these holes from board to board are not very accurate and cannot be relied on when working with an automatic machine tool of the type that requires precise positioning of the holes in the board relative to the tool. Accordingly, the invention provides the accuracy needed by utilizing an alignment system which monitors the very hole or holes in the board with which the machine tool is to communicate.

Although specific structures and embodiments have been described in detail, it should be understood that other structures and embodiments providing the same or similar function may be utilized.

What is claimed is:

1. An automatic part positioning system for precisely locating, with respect to a component inserting tool, a printed circuit board and the like with at least one hole therethrough, the system comprising a circuit board-supporting frame movable in a predetermined plane with two degrees of freedom;

servo means operatively coupled to said frame for moving said frame in said plane in response to error signals;

light generating means positioned adjacent one side of said frame for generating at least one beam of light toward said frame;

light detecting means disposed on the side of said frame opposite said light generating means and including two pairs of light detectors, each pair lying on a different one of two orthogonal lines for producing error signals relative to the direction of said orthogonal lines when said detectors are not illuminated equally; and beam dividing means disposed between said light generating means and said light detecting means on said side of said frame opposite said light generating means and intercepting light beam energy from said light generating means through said hole and directing said light beam energy toward selected ones of said light detectors, said light detectors only receiving such of said light beam energy passing through said plane.

2. The automatic part positioning system according to claim 1, wherein said light generating means includes a lamp structure producing a single light beam, and wherein said beam dividing means includes a quadrature beam splitting structure with opposite ones of the quadrature members being on orthogonal intersecting lines.

3. The automatic part positioning system according to claim 2, wherein said beam splitting structure is a light pipe bundle with an entrance end where the members of said bundle are immediately adjacent each other, while the members of said bundle are spaced apart at the other end of said bundle.

4. The automatic part positioning system according to claim 2, wherein said lamp structure includes a lamp, a lens system and a plate disposed between said lamp and said lens system, said plate including a single aperture therein through which light beam energy passes.

5. The automatic part positioning system according to claim 1, wherein said light generating means includes a lamp structure producing a pair of spaced light beams, and wherein said beam dividing means includes orthogonally oriented light beam splitting wedge structures each associated with and intercepting a different one of said light beams.

6. An automatic part positioning system for precisely locating a printed circuit board and the like with respect to a component inserting tool, comprising:
   a frame movable in a predetermined plane and having two degrees of freedom, said frame including holding means for supporting a printed circuit board having at least one pair of component-accepting holes, said holes being spaced a predetermined distance apart;
   servo means operatively coupled to said frame for moving said frame in said plane;
   light generating means positioned adjacent one side of said frame and producing a pair of parallel light beams spaced apart by said predetermined distance;
   light detecting means disposed on the side of said frame opposite said light generating means and including two pairs of light sensitive detectors, each pair lying on different intersecting orthogonal lines; and
   beam splitting means disposed adjacent said light detecting means and and intercepting said beams, said beam splitting means including orthogonally oriented wedges, each splitting a different one of said beams to illuminate equally each of said pairs of said detectors when said holes are in a predetermined alignment relative to said light beams and producing an error signal coupled to said servo means when not in said predetermined alignment.

7. An automatic part positioning system for precisely locating a printed circuit board and the like, the system comprising;
   at least one hole through said circuit board;
   a frame including circuit board-supporting structure, said frame being movable in a predetermined plane having two degrees of freedom;
   servo means operatively coupled to said frame for moving said frame in said plane in response to error signals;
   light generating means positioned on one side of said frame for generating a beam of light toward said predetermined plane;
   light detecting means disposed on the side of said frame opposite said light generating means; and
   means coupling the output of said light detecting means to said servo means for producing said error signals whenever said hole in a said circuit board carried by said frame is not in alignment relative to said light generating means and said light detecting means.

8. The automatic part positioning system according to claim 7, wherein said light detecting means includes two pairs of light detectors, each pair lying on a different one of two orthogonal lines, said light detecting means generating said error signals when said detectors are not illuminated equally.

9. The automatic part positioning system according to claim 8, also comprising beam dividing means disposed between said predetermined plane and said light detecting means and centered on said axis of said beam of light and directing any light beam energy from said beam of light incident thereon toward selected ones of said light detectors.

* * * * *